(12) United States Patent
Jang et al.

(10) Patent No.: US 9,966,530 B2
(45) Date of Patent: May 8, 2018

(54) RESISTIVE RANDOM ACCESS MEMORY DEVICE AND METHOD FOR FABRICATING THE SAME

(71) Applicant: Winbond Electronics Corp., Taichung (TW)

(72) Inventors: Wen-Yueh Jang, Hsinchu (TW); Chia Hua Ho, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days. days.

(21) Appl. No.: 15/634,349

(22) Filed: Jun. 27, 2017

(65) Prior Publication Data
US 2017/0294579 A1    Oct. 12, 2017

Related U.S. Application Data

(62) Division of application No. 14/861,242, filed on Sep. 22, 2015, now Pat. No. 9,728,720.

(30) Foreign Application Priority Data

Sep. 24, 2014   (TW) .............................. 103132925 A

(51) Int. Cl.
*H01L 45/00*   (2006.01)

(52) U.S. Cl.
CPC .......... *H01L 45/1253* (2013.01); *H01L 45/04* (2013.01); *H01L 45/1233* (2013.01); *H01L 45/146* (2013.01); *H01L 45/147* (2013.01); *H01L 45/1608* (2013.01)

(58) Field of Classification Search
CPC . H01L 45/04; H01L 45/1233; H01L 45/1253; H01L 45/146; H01L 45/147; H01L 45/16; H01L 27/224; H01L 27/108; H01L 27/11; H01L 2924/1435; H01L 27/0805
USPC ... 257/68, 71, 296, 298, 300, 314, 390, 516; 438/171, 190, 239, 329, 396
See application file for complete search history.

(56) References Cited

U.S. PATENT DOCUMENTS

| | | | |
|---|---|---|---|
| 2011/0001181 A1 | 1/2011 | Ju et al. | |
| 2012/0040528 A1* | 2/2012 | Kim | H01L 21/76816 438/675 |
| 2012/0287553 A1 | 11/2012 | Ramani et al. | |
| 2013/0330902 A1 | 12/2013 | Chen et al. | |
| 2015/0243914 A1* | 8/2015 | Wierzchowiec | H01L 51/0032 257/40 |
| 2015/0380477 A1 | 12/2015 | Huang et al. | |

FOREIGN PATENT DOCUMENTS

TW          201115721 A1    5/2011

* cited by examiner

*Primary Examiner* — Shahed Ahmed
(74) *Attorney, Agent, or Firm* — Muncy, Geissler, Olds & Lowe, P.C.

(57) ABSTRACT

A resistive random access memory device and a method for fabricating the same are presented. The resistive random access memory device includes a first electrode having a first dopant within. A second electrode is disposed on the first electrode. A resistive switching layer is disposed between the first electrode and the second electrode.

9 Claims, 7 Drawing Sheets

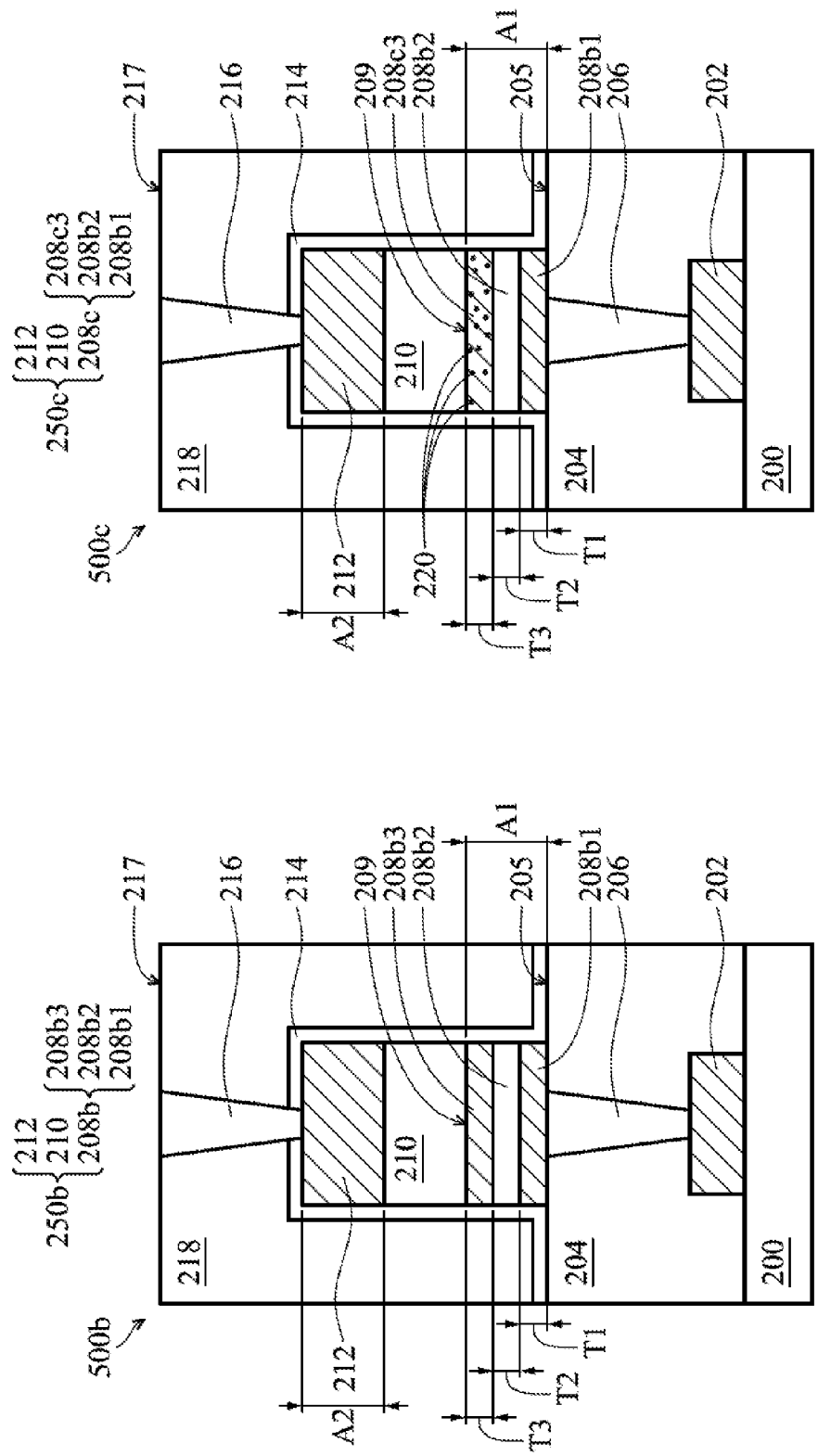

RESISTIVE RANDOM ACCESS MEMORY DEVICE AND METHOD FOR FABRICATING THE SAME

CROSS REFERENCE TO RELATED APPLICATIONS

This Application is a Divisional of co-pending application Ser. No. 14/861,242, filed on Sep. 22, 2015, for which priority is claimed under 35 U.S.C. § 120; and this application claims priority of Application No. 103132925 filed in Taiwan on Sep. 24, 2014 under 35 U.S.C. § 119; the entire contents of all of which are hereby incorporated by reference.

BACKGROUND OF THE INVENTION

Field of the Invention

The invention relates to a resistive random access memory device and method for fabricating the same, and in particular to a high reliability resistive random access memory device and method for fabricating the same.

Description of the Related Art

Resistive random access memory (RRAM) has advantages like low power consumption, low operating voltage, lower writing-erasing time, long durability, long memory time, nondestructive access, multi-state memory, simple process of element and scalable, and thus RRAM has become a mainstay of novel random access memory. The basic structure of conventional resistive random access memory is a metal-insulator-metal (MIM) stacked structure consisting of a bottom electrode, a resistive switching layer and a top electrode. The resistive switching (RS) resistance of the RRAM is an important feature of the device.

BRIEF SUMMARY OF THE INVENTION

An embodiment of the invention provides a resistive random access memory device comprising a first electrode having a dopant within. A second electrode disposed on the first electrode. A resistive switching layer disposed between the first electrode and the second electrode.

An embodiment of the invention provides a resistive random access memory device comprising a first electrode, wherein the first electrode is a stacked structure, comprising: a metal nitride layer having a first thickness; and a metal oxide layer having a second thickness and deposed on the metal nitride. A second electrode is disposed on the first electrode, wherein both the first thickness and the second thickness are smaller than a thickness of the second electrode. A resistive switching layer is disposed between the first electrode and the second electrode.

An embodiment of the invention provides a method for fabricating a resistive random access memory device, comprising providing a semiconductor substrate. Forming a first electrode on the semiconductor substrate. Doping a dopant in the first electrode. Forming a resistive switching layer on the first electrode. Forming a second electrode on the resistive switching layer.

An embodiment of the invention provides a method for fabricating a resistive random access memory device, comprising providing a semiconductor substrate, and forming a first electrode on the semiconductor substrate, wherein forming the first electrode comprises forming a metal nitride layer on the semiconductor substrate, wherein the metal nitride layer has a first thickness; forming a metal oxide layer on the metal nitride layer, wherein the metal oxide layer has a second thickness; forming a resistive switching layer on the first electrode; and forming a second electrode on the resistive switching layer. Both the first thickness and the second thickness are smaller than the thickness of the second electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2 illustrates a cross-sectional view of a resistive random access memory device according to alternative exemplary embodiment of the invention.

FIG. 3 illustrates a cross-sectional view of a resistive random access memory device according to another alternative exemplary embodiment of the invention.

DETAILED DESCRIPTION OF THE INVENTION

The purposes, features and advantages of the embodiment of the invention can be better understood by referring to the following detailed description with reference to the accompanying drawings. The specification of the invention provides alternative embodiments to describe alternative features of performing the method of the invention. Furthermore, the configuration of each element in the embodiments is for the purposes of explanation, but is not intended to limit the present disclosure. In addition, the present disclosure may repeat reference numbers and/or letters in the various embodiments. This repetition is for the purpose of simplicity and clarity, and does not imply any relationship between the different embodiments and/or configurations discussed.

An embodiment of the invention provides a method for fabricating a random access memory, e.g. a resistive random access memory (RRAM) device, to solve the problem of large variance of resistance switching feature caused by poor planarity of the interface between a bottom electrode and a resistive switching layer for conventional resistive random access memory. The problem mentioned above may be caused by the recrystallized grain of the bottom electrode having a non-uniform size during a Back-End-of-Line (BEOL) process with thermal treatment. In the resistive random access memory device according to an embodiment of the invention, a dopant is doped during or after the formation of the bottom electrode. Alternatively, a bottom electrode with a stacked structure of a metal nitride layer and a metal oxide layer may be formed, and the equivalent thickness of the metal nitride contacting a resistive switching layer may be reduced. After the Back-End-of-Line (BEOL) process with thermal treatment, the bottom electrode with crystalline state will has a smaller and more uniform grain size, thereby increasing planarity of the interface between the bottom electrode and the resistive switching layer.

Figure 1:
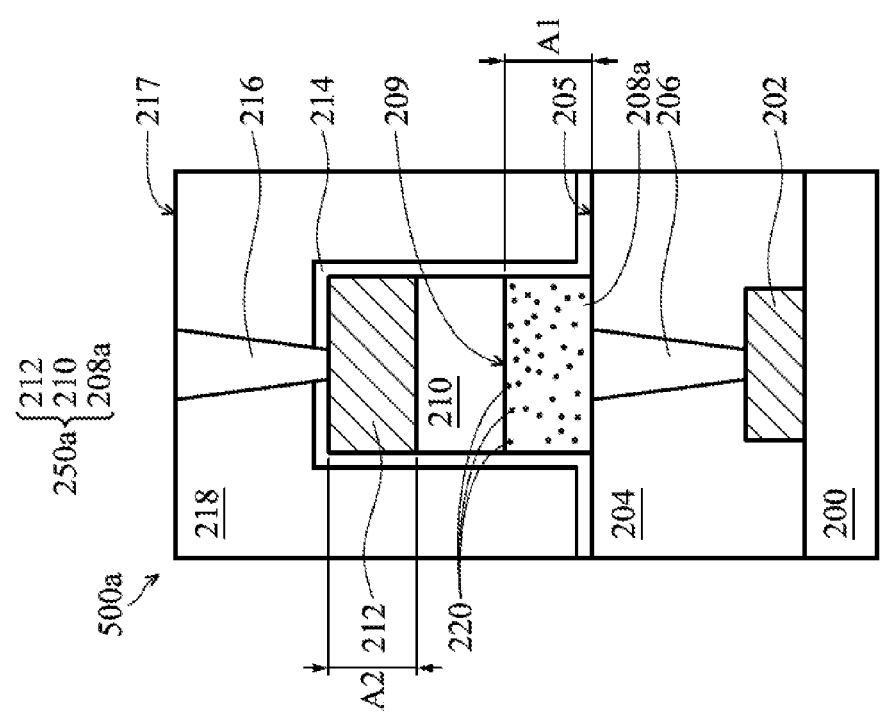
FIG. 1 illustrates a cross-sectional view of a resistive random access memory device according to an exemplary embodiment of the invention.

FIG. 1 illustrates a cross-sectional view of a resistive random access memory device 500a. As shown in FIG. 1, a resistive random access memory device 500a may be disposed on a semiconductor substrate 200, e.g. a silicon substrate, and may be connected to a circuit 202 disposed on the semiconductor substrate 200. Other various separate electronic elements may be disposed on the semiconductor substrate 200, and the electronic elements may include a transistor, diode, capacitor, inductor, and other active or inactive semiconductor element. Main elements of the resistive random access memory device 500a include a first electrode contact plug 206, a first electrode 208a, a resistive switching layer 210, a second electrode 212, and a second electrode contact plug 216. The first electrode 208a, the resistive switching layer 210, and the second electrode 212 together constitute a metal-insulator-metal (MIM) stacked layer 250a.

As shown in FIG. 1, the first electrode contact plug 206 is disposed on the semiconductor substrate 200 and electrically connected to the circuit 202 disposed in the semiconductor substrate 200. The first electrode contact plug 206 penetrates through an interlayer dielectric layer 204 disposed on the semiconductor substrate 200. In some embodiments of the invention, the circuit 202 is configured to apply operating voltage to the resistive random access memory device 500a. The circuit 202 may include a circuit combined with electronic elements, e.g. transistors, diodes, capacitors and resistors. The first electrode contact plug 206 may include tungsten (W).

As shown in FIG. 1, the first electrode 208a is disposed on the first electrode contact plug 206 and contacts the first electrode contact plug 206. The first electrode 208a may be regarded as a bottom electrode 208a. Therefore, the first electrode contact plug 206 may be regarded as a bottom electrode contact plug 206. As shown in FIG. 1, the first electrode 208a has a dopant 220. In some embodiments of the invention, the first electrode 208a may include titanium nitride. In other embodiments of the invention, the first electrode 208a may include tantalum, titanium or combination thereof. The first electrode 208a may formed by an electron beams vacuum evaporating or a sputtering process. During the formation of the first electrode 208a, multiple conductive layers may be formed on the interlayer dielectric layer 204. In some embodiments of the invention, dopant 220 may include carbon, boron or combination thereof. The metal material forming the first electrode and the dopant 220 may be combined and fabricated into a sputter target. A co-sputtering process may be utilized to sputter the dopant 220 into the first electrode 208a during sputtering and depositing the first electrode material layer. In other embodiments of the invention, after forming the first electrode 208a, an ion implantation process may be utilized to sputter the dopant 220 into the first electrode 208a.

As shown in FIG. 1, a second electrode 212 is disposed on the first electrode 208a. The second electrode 212a may be regarded as a top electrode 212. The material and formation method of the second electrode 212a may be same as or similar with that of the first electrode 208. In some embodiments of the invention, the second electrode 212a may comprise no dopant. In other embodiments of the invention, the second electrode 212 may comprise a dopant that is the same as or similar to the dopant 220. The formation method of the second electrode 212 with the dopant may be same as or similar to that of the first electrode 208a with the dopant 220.

As shown in FIG. 1, the first electrode 208a has a thickness A1, and the second electrode 212 has a thickness A2. In some embodiments of the invention, the thickness A1 of the first electrode 208a may be designed to be equal to or less than the thickness A2 of the second electrode 212.

As shown in FIG. 1, the resistive switching layer 210 is disposed on the first electrode 208a with the dopant 220 and located between the first electrode 208a and the second electrode 212. The resistive switching layer 210 contacts the first electrode 208a with dopant 220 and the second electrode 212. The resistive switching layer 210 may comprise hafnium dioxide, aluminum oxide, chromium doped strontium titanate, chromium doped strontium zirconate, zirconium dioxide film, or combination with two species or more than two species thereof. The resistive switching layer 210 may be formed by an atomic layer deposition (ALD) process.

As shown in FIG. 1, the second electrode contact plug 216 is disposed on the second electrode 212. The second electrode contact plug 216 penetrates through the interlayer dielectric layer 218 and a barrier liner layer 214 which is conformally formed on the metal-insulator-metal stacked layer 250a and contacts the second electrode 212. The first electrode contact plug 206 penetrates through the interlayer dielectric layer 204 and contacts the first electrode 208a. The second electrode contact plug 216 may be regarded as a top electrode contact plug 216. The first electrode contact plug 206 and the second electrode contact plug 216 may have the same or a similar material and forming method.

FIG. 2 illustrates a cross-section view of a resistive random access memory device 500b. The difference between the resistive random access memory device 500b and the resistive random access memory device 500a is that the first electrode 208b of the resistive random access memory device 500b is a stacked structure including a metal nitride layer 208b1, a metal oxide layer 208b2 and a metal nitride layer 208b3. As shown in FIG. 2, the metal oxide layer 208b2 is disposed between the metal nitride layer 208b1 and the metal nitride layer 208b3, such that the metal nitride layer 208b3 of the first electrode 208b can contact the resistive switching layer 210 and the metal nitride layer 208b1 can contact the first electrode contact plug 206. In some embodiments of the invention, the metal nitride layer 208b1 and 208b3 may comprise titanium nitride, and the metal oxide layer 208b2 may comprise titanium oxide. As shown in FIG. 2, the metal nitride layer 208b1 has a thickness T1, and the metal oxide layer 208b2 has a thickness T2, and the metal nitride layer 208b3 has a thickness T3. In some embodiments of the invention, the thicknesses T1-T3 may be designed to be less than the thickness A2 of the second electrode 212. A total thickness A1 of the metal nitride layer 208b1, 208b3 and the metal oxide layer 208b2 may be designed to be equal to or less than the thickness A2 of the second electrode 212. In other embodiments of the invention, the numbers of the layers of the metal nitride layer and the metal oxide layer of the first electrode 208b is not specifically limited as long as both the resistive switching layer 210 and the first electrode contact plug 206 contact the metal nitride layer, and the thickness of each metal nitride layer is less than the thickness A2 of the second electrode 212.

FIG. 3 illustrates a cross-section view of a resistive random access memory device 500c. The difference between the resistive random access memory device 500c and the resistive random access memory device 500b is that a metal nitride layer 208c3 in the first electrode 208b of the resistive random access memory device 500c contacting the resistive switching layer 210 has a dopant 220. In some embodiments of the invention, the metal nitride layer 208c3 may comprise titanium nitride. In other embodiments of the invention, the metal nitride layer also has a dopant that is the same as or similar to dopant 220. As shown in FIG. 3, the metal nitride layer 208c3 contacting the resistive switching layer 210 and having the dopant 220 has a thickness T3 that may be designed to be less than the thickness A2 of the second electrode 212. A total thickness A1 of the metal nitride layer 208b1, the metal nitride layer 208c3 with the dopant 220, and the metal oxide layer 208b2 may be designed to be equal to or less than the thickness A2 of the second electrode 212.

Subsequently, FIGS. 1, 4A and 4B-5 illustrate the fabricating method of the resistive random access memory device 500a, wherein FIGS. 4A, 4A and 4B-5 illustrate cross-sectional views of intermediate process steps of the resistive random access memory device. At first, a semiconductor substrate 200 is provided as shown in FIG. 1, and an RCA (Radio Corporation of America) cleaning process is performed. Then a circuit 202 is formed as shown in FIG. 1 on the semiconductor substrate 200 by a deposition and a patterning process. Then an interlayer dielectric layer 204 is blanketly deposited as shown in FIG. 1 by a chemical vapor deposition (CVD) or plasma enhanced chemical vapor deposition (PECVD). Then, an opening in the interlayer dielectric layer 204 is formed by a patterning process, e.g. a lithography process and an anisotropic etching process to define the location where the first (bottom) electrode contact plug 206 is formed. In addition, the circuit 202 is partially exposed from the opening. Then, a barrier layer, e.g. titanium and titanium nitride, is deposited on the sidewall of the opening by a sputtering process. Then, a conductive material such as tungsten is filled into the opening, and a planarization process such as a chemical mechanical polishing process is performed to remove the excess conductive material over a top surface 205 of the interlayer dielectric layer 204, so as to form the first (bottom) electrode contact plug 206 as shown in FIG. 1 in the opening.

Figure 4B:
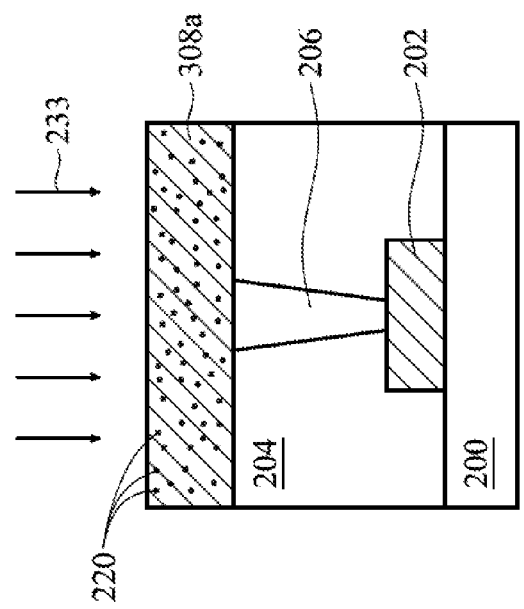
FIG. 4B illustrates a cross-sectional view of intermediate process steps of a resistive random access memory device according to alternative exemplary embodiment of the invention.
Figure 4A:
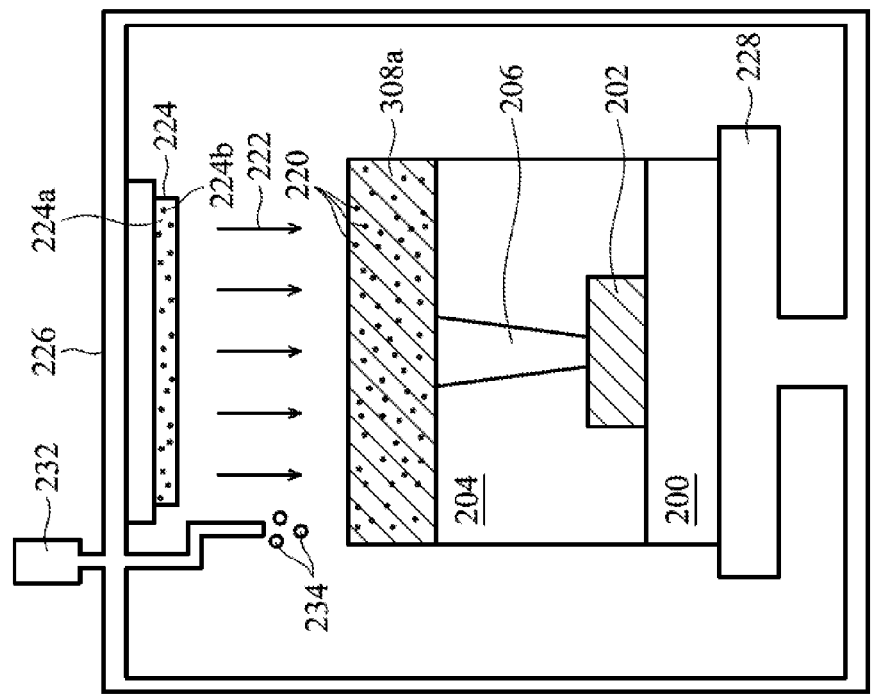
FIG. 4A illustrates a cross-sectional views of intermediate process steps of a resistive random access memory device according to an exemplary embodiment of the invention.

Then, FIG. 4A illustrates a formation method of a first electrode material with the dopant 220. As shown in FIG. 4A, the structure including the semiconductor substrate 200, circuit 202, interlayer dielectric layer 204 and the first electrode contact plug 206 is placed on a carrier 228 in a sputter chamber 226. In some embodiments of the invention, the sputter chamber 226 further includes a sputter target 224 and a gas source 232. The sputter target 224 may be composed of a metal material 224a and a dopant 224b. In some embodiments of the invention, the metal material 224a may comprise titanium, and the dopant 224b may comprise carbon, boron or combination thereof. As shown in FIG. 4A, the gas source 232 is used to provide a gas 234 during process period. During the formation of the first electrode material layer 308a, the gas 234 may comprise nitrogen. Then, a first electrode material layer 308a is formed on the interlayer dielectric layer 204 by a sputtering process 222. Because the sputter target 224 is composed of the metal material 224a and the dopant 224b, the metal material 224a and the dopant 224b may be co-sputtered on the interlayer dielectric layer 204 while performing the sputtering process 222, and thus a first electrode material layer 308a with the dopant 220 is formed. Therefore, the sputtering process 222 as shown in FIG. 4A may be regarded as a co-sputtering process 222.

FIG. 4B illustrates another formation method of the first electrode material layer 308a with the dopant 220. As shown in FIG. 4B, after forming the first electrode contact plug 206 as shown in FIG. 1, the first electrode material layer 308a is formed on the interlayer dielectric layer 204 by an electron beams vacuum evaporating or a sputtering process. Then an ion implantation process 233 is performed to dope the dopant 220 into the first electrode material layer 308a. In some embodiments of the invention, the first electrode material layer 308a with the dopant 220 as shown in FIGS. 4A and 4B may be amorphous phase.

Figure 5:
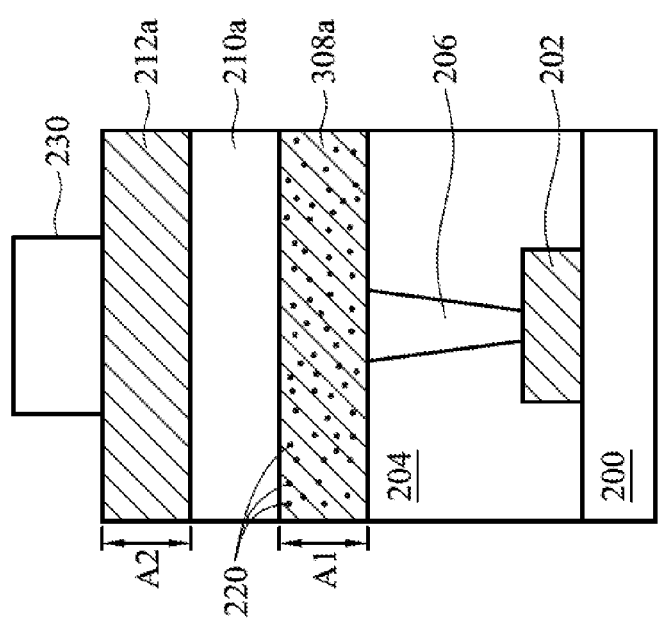
FIG. 5 illustrates a cross-sectional view of intermediate process steps of a resistive random access memory device according to an exemplary embodiment of the invention.

Then, as shown in FIG. 5, a resistive switching material layer 210a is grown on the first electrode material layer 308a by an atomic layer deposition (ALD) process. The resistive switching material layer 210a contacts the first electrode material layer 308a with the dopant 220.

Subsequently, referring to FIG. 5, a second electrode material layer 212a is formed on the resistive switching layer material 210a by a deposition process, e.g. an electron beams vacuum evaporating or a sputtering process. In other embodiments of the invention, the second electrode material layer 212a with the dopant may be formed by the co-sputtering process 222 as shown in FIG. 4A or the deposition process and the subsequent ion implantation process 233 as shown in FIG. 4B. In some embodiments of the invention, the second electrode material layer 212a with the dopant 220 as shown in FIG. 5 may be amorphous phase.

Still referring to FIG. 5, then a lithography process and an etching process is performed to form a hard mask pattern 230 on the second electrode material layer 212a.

Then, the hard mask pattern 230 is used as a mask, and an etching process is performed to remove the second electrode material layer 212a, the resistive switching material layer 210a and the first electrode material layer 308a which are not covered by the hard mask pattern 230, so as to form the metal-insulator-metal stacked layer 250a composed of the second electrode 212, the resistive switching layer 210 and first electrode 208a as shown in FIG. 1.

Subsequently, referring to FIG. 1 again, a barrier liner layer 214 is conformally formed on the metal-insulatormetal stacked layer 250a by a deposition process such as an ALD process or a CVD process. In some embodiments of the invention, the barrier liner layer 214 extends onto the top surface 205 of the interlayer dielectric layer 204 which is not covered by the metal-insulator-metal stacked layer 250a, wherein the barrier liner layer 214 may comprise silicon nitride.

Then, referring to FIG. 1 again, an interlayer dielectric layer 218 is deposited blanketly by a CVD or PECVD process, wherein the interlayer dielectric layer 218 covers the barrier liner layer 214. Then an opening is formed in the interlayer dielectric layer 218 and the barrier liner layer 214 by a patterning process including lithography and anisotropic etching process, so as to define a location where the second electrode contact plug 216 is formed and to expose a portion of the second electrode 212 from the opening. Then a barrier layer such as titanium and titanium nitride is deposited on the sidewall of the opening by sputtering process, and a conductive material such as tungsten is filled into the opening, and then a planarization process such as a chemical mechanical polishing process is performed to remove the excess conductive material over a top surface 217 of the interlayer dielectric layer 218, so as to form the second electrode contact plug 216 in the opening. Subsequently, a Back-End-of-Line (BEOL) process with thermal treatment is performed to form an interconnect structure connecting to the second electrode contact plug 216 or other circuit. After the process mentioned above, the resistive random access memory device 500a is accomplished. After the Back-End-of-Line (BEOL) process, the amorphous phase first electrode 208a and second electrode 212 become crystalline first electrode 208a and second electrode 212 due to the temperature effect of the thermal treatment. In addition, the crystalline first electrode 208a has a smaller and more uniform size of grain due to the existence of the dopant 220 and may increase the planarity of the interface 209 between the first electrode (bottom electrode) 208a and the resistive switching layer 210.

In addition, FIGS. 2, 6-8A and 9A illustrate the fabricating method of the resistive random access memory device 500b. FIGS. 6-8A and 9A illustrate cross-sectional views of intermediate process steps of the resistive random access memory device 500b as shown in FIG. 2. Note that the same or like elements corresponding to those of the elements as shown in FIGS. 1, 4A-4B and 5 have the same meaning as for the preceding paragraph and will not be repeated for the sake of brevity.

Figure 6:
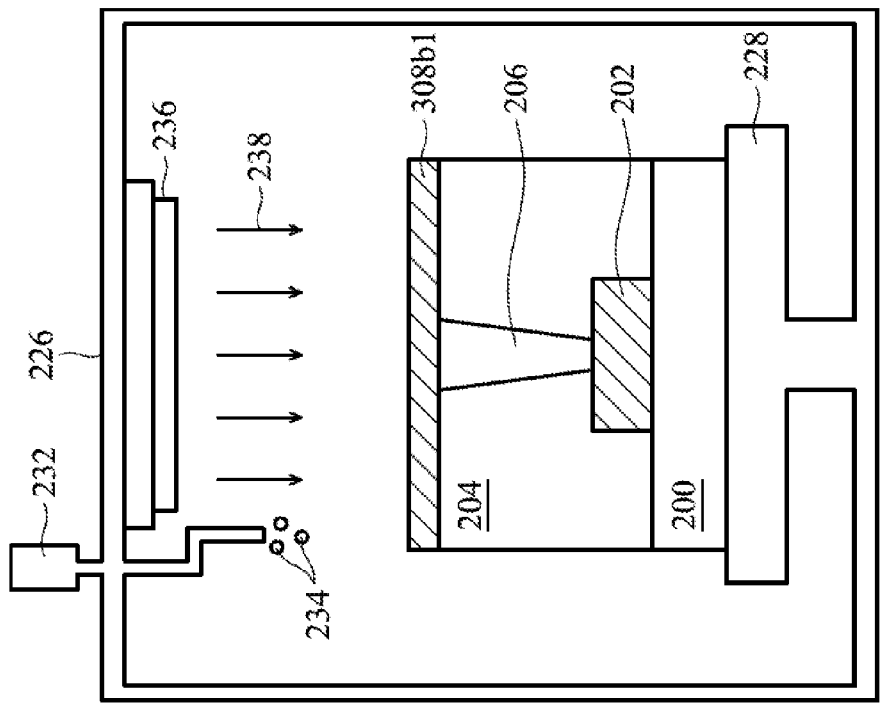
FIG. 6 illustrates a cross-sectional view of intermediate process steps of a resistive random access memory device according to an exemplary embodiment of the invention.

As shown in FIG. 6, the structure including the semiconductor substrate 200, circuit 202, interlayer dielectric layer 204 and the first electrode contact plug 206 is placed on a carrier 228 in a sputter chamber 226. In some embodiments of the invention, the sputter chamber 226 further includes a sputter target 236 and a gas source 232. The sputter target 236 may be composed of a metal material. In some embodiments of the invention, the metal material may comprise titanium. As shown in FIG. 6, the gas source 232 is used to provide a gas 234 during process period. During the formation of a metal nitride material layer 308b1, the gas 234 may comprise nitrogen. Then, the metal nitride layer 308b1 is formed on the interlayer dielectric layer 204 by a sputtering process 238. In other embodiments of the invention, the metal nitride material layer 308b1 is formed by a deposition process such as electron beams vacuum evaporating process.

Figure 7:
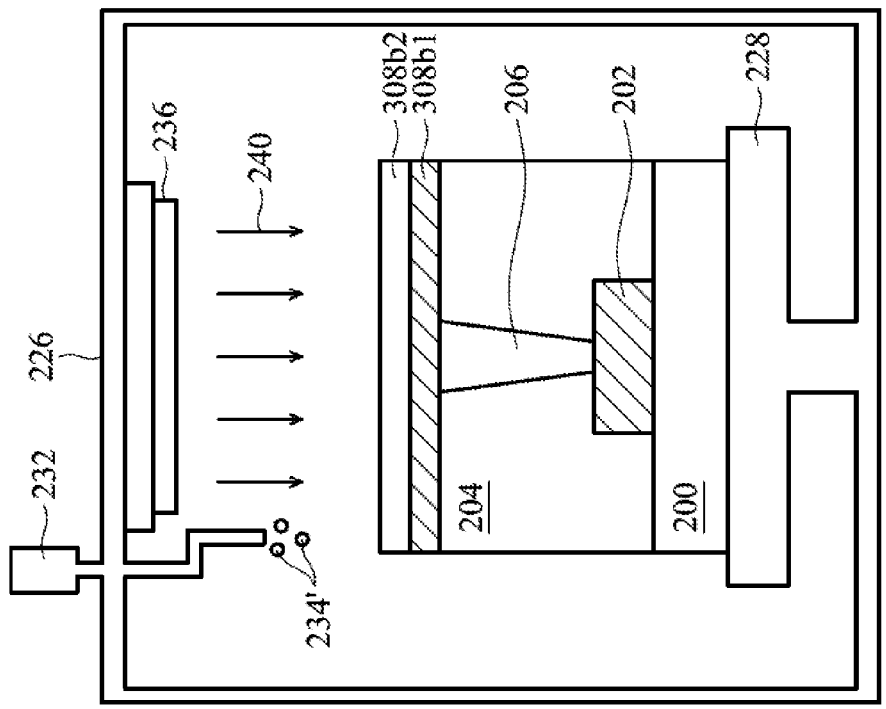
FIG. 7 illustrates a cross-sectional view of intermediate process steps of a resistive random access memory device according to an exemplary embodiment of the invention.

Then, referring to FIG. 7, a gas 234' is introduced into the sputter chamber 226 using the gas source 232 and a sputtering process 240 is performed to form a metal oxide material layer 308b2 on the metal nitride material layer 308b1 using the same sputter target 236. In some embodiments of the invention, the gas 234' is different form the gas 234 (FIG. 6), and the gas 234' may comprise oxygen.

Figure 8A:
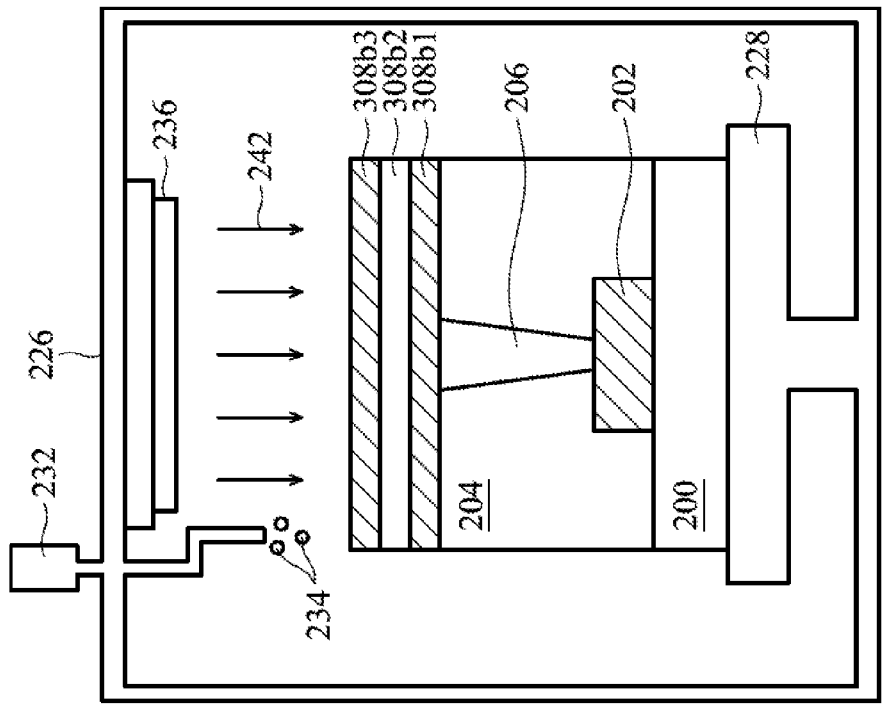
FIG. 8A illustrates a cross-sectional view of intermediate process steps of a resistive random access memory device according to an exemplary embodiment of the invention.

Then, referring to FIG. 8A, a gas 234 is introduced into the sputter chamber 226 by the gas source 232 and a sputtering process 242 is performed using the same sputter target 236 to form a metal nitride material layer 308b3 on the metal oxide material layer 308b2. In some embodiments of the invention, the metal nitride material layer 308b1, the metal oxide material layer 308b2 and the metal nitride material layer 308b3 may be formed continuously in the same sputter chamber 226, and the metal nitride material layer 308b1, the metal oxide material layer 308b2 and the metal nitride material layer 308b3 may be amorphous phase.

Figure 9A:
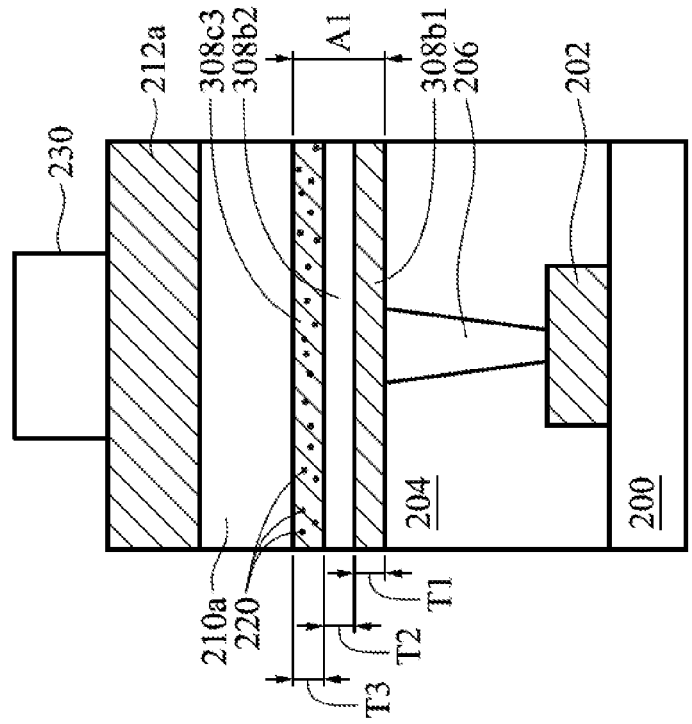
FIG. 9A illustrates a cross-sectional view of intermediate process steps of a resistive random access memory device according to an exemplary embodiment of the invention.

Subsequently, as shown in FIG. 9A, a resistive switching material layer 210a is grown on a stacked structure composed of the metal nitride material layer 308b1, the metal oxide material layer 308b2 and the metal nitride material layer 308b3 by a deposition process such as an ALD process. The resistive switching material layer 210a contacts the metal nitride material layer 308b3 of the stacked structure. As shown in FIG. 9A, the metal nitride material layer 308b1 has a thickness T1, the metal oxide material layer 308b2 has a thickness T2, and the metal nitride material layer 308b3 has a thickness T3. In some embodiments of the invention, the thicknesses T1-T3 may be designed to be less than the thickness A2 of the second electrode 212. In other embodiments of the invention, thicknesses T1-T3 may be equal to or different from each other.

Subsequently, referring to FIG. 9A, a second electrode material layer 212a is formed on the resistive switching material layer 210a by a deposition process such as electron beams vacuum evaporating or sputtering process. In some embodiments of the invention, a total thickness A1 of the stacked structure composed of the metal nitride material layer 308b1, the metal oxide material layer 308b2 and the metal nitride material layer 308b3 may be equal to or less than the thickness A2 of the second electrode material layer 212a. In other embodiments of the invention, the second electrode material layer 212a with the dopant may be formed by the co-sputtering process 222 as shown in FIG. 4A or the deposition process and the subsequent ion implantation process 233 as shown in FIG. 4B. Alternatively, a stacked structure that is the same as or similar to the metal nitride material layer 308b1, the metal oxide material layer 308b2 and the metal nitride material layer 308b3 may be formed by sputtering process 238, 240 and 242 as shown in FIGS. 6, 7 and 8A. In some embodiments of the invention, the second electrode material layer 212a with the dopant 220 as shown in FIG. 9A may be amorphous phase.

Referring to FIG. 9A, a lithography process and an etching process is performed to form a hard mask pattern 230 on the second electrode material layer 212a. Then, the hard mask pattern 230 is used as a mask, and an etching process is performed to remove the second electrode material layer 212a, the resistive switching material layer 210a, and the stacked structure composed of the metal nitride material layer 308b1, the metal oxide material layer 308b2 and the metal nitride material layer 308b3 which are not covered by the hard mask pattern 230, so as to form the metal-insulator-metal stacked layer 250b composed of the second electrode 212, the resistive switching layer 210 and first electrode 208b (including the metal nitride layer 208b1, the metal oxide material layer 208b2 and the metal nitride material layer 208b3) as shown in FIG. 2.

Subsequently, referring to FIG. 2 again, a barrier liner layer 214 is conformally formed on the metal-insulatormetal stacked layer 250b. In some embodiments of the invention, the material and the formation method of the barrier liner layer 214 have the same meaning as for the preceding paragraph and will not be repeated for the sake of brevity.

Then, referring to FIG. 2 again, an interlayer dielectric layer 218 is blanketly deposited, wherein the interlayer dielectric layer 218 covers the barrier liner layer 214. Then, the second electrode contact plug 216 is formed in the opening of the interlayer dielectric layer 218. The material and the formation method of interlayer dielectric layer 218 and the second electrode contact plug 216 have the same meaning as for the preceding paragraph and will not be repeated for the sake of brevity. Subsequently, a Back-End-of-Line (BEOL) process with thermal treatment is performed to form an interconnect structure connecting to the second electrode contact plug 216 or other circuit. After the process mentioned above, the resistive random access memory device 500b is accomplished. After the Back-End-of-Line (BEOL) process, the amorphous phase first electrode 208b and second electrode 212 become crystalline first electrode 208b and second electrode 212 due to the temperature effect of the thermal treatment. In addition, due to the thickness T3 of the metal nitride material layer 208b3 contacting the resistive switching layer 210 designed to be less than the thickness A2 of the second electrode 212, the crystalline first electrode 208b has a smaller and more uniform size of grain and may increase the planarity of the interface 209 between the first electrode (bottom electrode) 208b and the resistive switching layer 210 after a high-temperature process.

Furthermore, FIGS. 3, 6-7, 8B and 9B illustrate the fabricating method of the resistive random access memory device 500c. FIGS. 6-7, 8B and 9B illustrate cross-sectional views of intermediate process steps of the resistive random access memory device 500c. Note that the same or like elements corresponding to those of the elements as shown in FIGS. 1, 4A, 4B-7, 8A and 9A have the same meaning as for the preceding paragraph and will not be repeated for the sake of brevity.

Figure 8C:
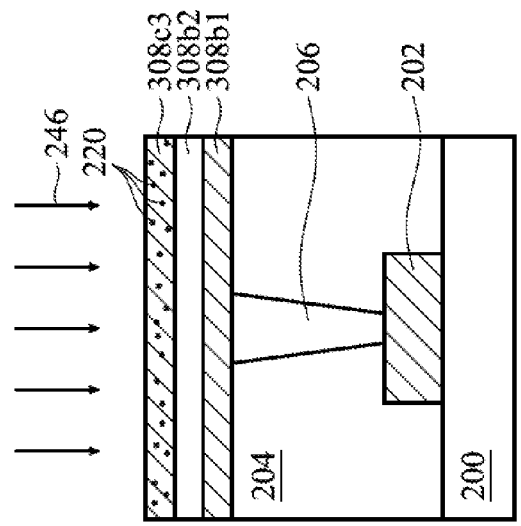
FIG. 8C illustrates a cross-sectional view of intermediate process steps of a resistive random access memory device according to another alternative exemplary embodiment of the invention.
Figure 8B:
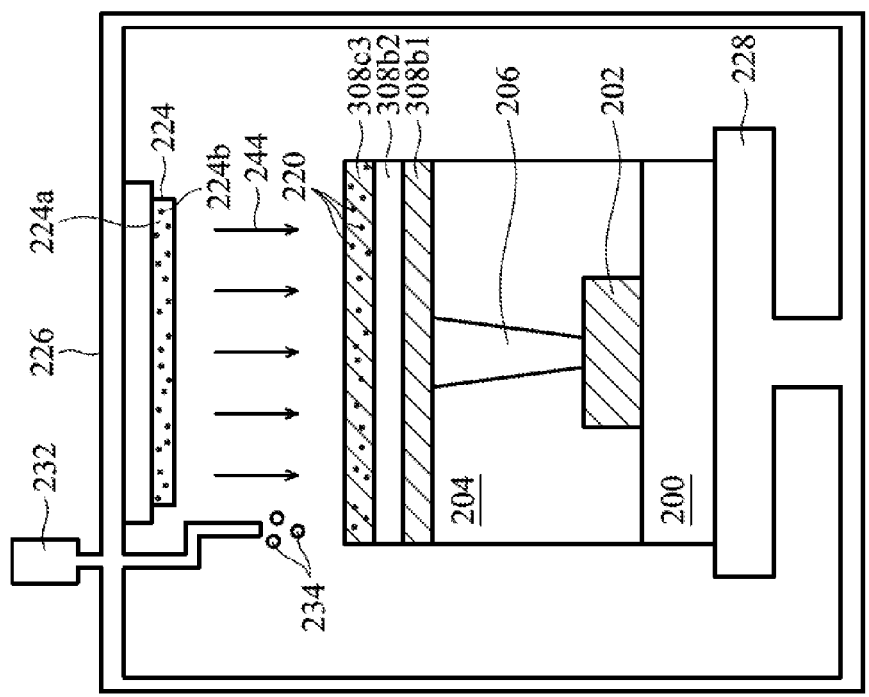
FIG. 8B illustrates a cross-sectional view of intermediate process steps of a resistive random access memory device according to alternative exemplary embodiment of the invention.

After forming the metal nitride material layer 308b1 and the metal oxide material layer 308b2 as shown in FIGS. 6 and 7, referring to FIG. 8B, a gas 234 is introduced into the sputter chamber 226 using the gas source 232, and a sputtering process 244 is performed to form a metal nitride material layer 308c3 on the metal oxide material layer 308b2 using the same sputter target 224 as shown in FIG. 4A. Because the sputter target 224 is composed of the metal material 224a and the dopant 224b, the metal material 224a and the dopant 224b will be co-sputtered on the metal oxide material layer 308b2 while performing the sputtering process 244, and thus the metal nitride material layer 308c3 with the dopant 220 is formed. In some embodiments of the invention, the metal nitride material layer 308b1, the metal oxide material layer 308b2 and the metal nitride material layer 308c3 with the dopant 220 may be formed continuously in the same sputter chamber 226, and the metal nitride material layer 308b1, the metal oxide material layer 308b2 and the metal nitride material layer 308c3 may be amorphous phase.

FIG. 8C illustrates another formation method of the metal nitride material layer 308c3 with the dopant 220. As shown in FIG. 8C, after forming the first electrode contact plug 206 as shown in FIG. 1, the metal nitride material layer 308b1, the metal oxide material layer 308b2, and the metal nitride material layer 308c3 are formed on the interlayer dielectric layer 204 by an electron beams vacuum evaporating or a sputtering process. Then an ion implantation process 246 is performed to dope the dopant 220 into the metal nitride material layer 308c3. In some embodiments of the invention, the metal nitride material layer 308c3 with the dopant 220 as shown in FIGS. 8B and 8C may be amorphous phase.

Figure 9B:
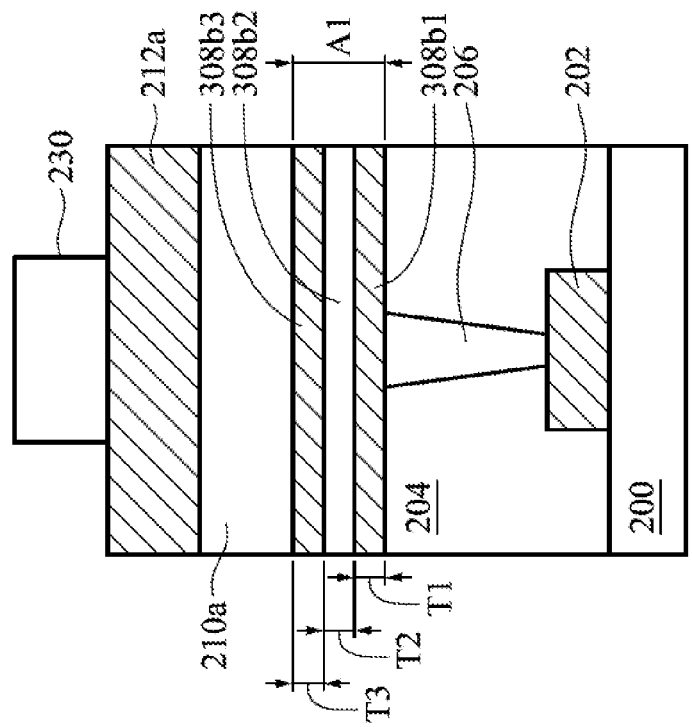
FIG. 9B illustrates a cross-sectional view of intermediate process steps of a resistive random access memory device according to alternative exemplary embodiment of the invention.

Subsequently, as shown in FIG. 9B, a resistive switching material layer 210a and a second electrode material layer 212a are sequentially formed on the stacked structure composed of the metal nitride material layer 308b1, the metal oxide material layer 308b2 and the metal nitride material layer 308c3 with the dopant 220. The resistive switching material layer 210a contacts the metal nitride material layer 308c3 with the dopant 220 in the stacked structure. In some embodiments of the invention, the material and the formation method of the resistive switching material layer 210a and second electrode material layer 212a have the same meaning as for the preceding paragraph and will not be repeated for the sake of brevity.

As shown in FIG. 9B, a total thickness A1 of the stacked structure composed of the metal nitride material layer 308b1, the metal oxide material layer 308b2 and the metal nitride material layer 308c3 with the dopant 220 may be equal to or less than the thickness A2 of the second electrode material layer 212a. In other embodiments of the invention, the second electrode material layer 212a with the dopant may be formed by the co-sputtering process 222 as shown in FIG. 4A or the deposition process and the subsequent ion implantation process 233 as shown in FIG. 4B. Alternatively, a stacked structure that is the same as or similar to the metal nitride material layer 308b1, the metal oxide material layer 308b2 and the metal nitride material layer 308b3 formed by sputtering process 238, 240 and 242 as shown in FIGS. 6, 7 and 8A. Alternatively, a stacked structure that is the same as or similar to the metal nitride material layer 308b1, the metal oxide material layer 308b2 and the metal nitride material layer 308c3 is formed by sputtering process 238, 240 and 242 as shown in FIGS. 6, 7 and 8B. In some embodiments of the invention, the second electrode material layer 212a as shown in FIG. 9B may be amorphous phase.

Subsequently, FIGS. 9B and 3 illustrate the definition of the formation method of the metal-insulator-metal stacked layer 250c. As shown in FIG. 9B, then a lithography process and an etching process are performed to form a hard mask pattern 230 on the second electrode material layer 212a to define the area and forming location of the subsequently formed the second electrode 212, the resistive switching layer 210 and the first electrode 208.

Subsequently, referring to FIG. 3 again, the hard mask pattern 230 is used as a mask, and an etching process is performed to remove the second electrode material layer 212a, the resistive switching material layer 210a, and the stacked structure composed of the metal nitride material layer 308b1, the metal oxide material layer 308b2 and the metal nitride material layer 308c3 with the dopant 220 which are not covered by the hard mask pattern 230, so as to form the metal-insulator-metal stacked layer 250c composed of the second electrode 212, the resistive switching layer 210 and first electrode 208c (including the metal nitride layer 208b1, the metal oxide material layer 208b2 and the metal nitride material layer 208c3 with the dopant 220) as shown in FIG. 3.

Subsequently, referring to FIG. 3 again, a barrier liner layer 214 is conformally formed on the metal-insulator-metal stacked layer 250c. In some embodiments of the invention, the material and the formation method of the barrier liner layer 214 have the same meaning as for the preceding paragraph and will not be repeated for the sake of brevity.

Then, referring to FIG. 3 again, an interlayer dielectric layer 218 is blanketly deposited, wherein the interlayer dielectric layer 218 covers the barrier liner layer 214. Then, the second electrode contact plug 216 is formed in the opening of the interlayer dielectric layer 218. The material and the formation method of interlayer dielectric layer 218 and the second electrode contact plug 216 have the same meaning as for the preceding paragraph and will not be repeated for the sake of brevity. Subsequently, a Back-End-of-Line (BEOL) process with thermal treatment is performed to form an interconnect structure connecting the second electrode contact plug 216 or other circuits. After the process mentioned above, the resistive random access memory device 500c is accomplished. After the Back-End-of-Line (BEOL) process, the amorphous first electrode 208c and second electrode 212 become crystalline first electrode 208c and second electrode 212 due to the temperature effect of the thermal treatment. In addition, due to the existence of the dopant 220, and due to that the thickness T3 of the metal nitride material layer 208c3 contacting the resistive switching layer 210 is designed to be less than the thickness A2 of the second electrode 212, the crystalline first electrode 208c has a smaller and more uniform grain size, thereby increasing the planarity of the interface 209 between the first electrode (bottom electrode) 208c and the resistive switching layer 210.

The embodiments of the invention provide a resistive random access memory and fabricating the same. The crystalline grain size of the bottom electrode is controlled by doping the dopant into the bottom electrode or reducing the thickness of the bottom electrode, so as to increase the planarity of the interface between the bottom electrode and the resistive switching layer in the resistive random access memory device, which in turn improves the reliability of the resistive random access memory device.

Although some embodiments of the present disclosure have been described in detail, it is to be understood that the invention is not limited to the disclosed embodiments. It will be apparent to those skilled in the art that various modifications and variations can be made to the disclosed embodiments. Therefore, it is intended that the specification and examples be considered as exemplary only, with a true scope of the disclosure being indicated by the following claims and their equivalents.

What is claimed is:

1. A method for fabricating a resistive random access memory device, comprising:
   providing a semiconductor substrate;
   forming a first electrode on the semiconductor substrate;
   doping a dopant in the first electrode;
   forming a resistive switching layer on the first electrode; and
   forming a second electrode on the resistive switching layer, wherein a thickness of the first electrode is smaller than a thickness of the second electrode.

2. The method as claimed in claim 1, wherein the step of doping the dopant in the first electrode is performed during the formation of the first electrode, and the step of forming the first electrode comprises performing a co-sputtering process using a first electrode material and the dopant as a sputter target.

3. The method as claimed in claim 1, wherein the step of doping the dopant into the first electrode is performed after forming the first electrode, and the step of doping the dopant into the first electrode comprises performing an ion implantation to dope the dopant into the first electrode.

4. The method as claimed in claim 1, wherein the step of forming the first electrode comprises:
   placing a sputter target into a sputter chamber;
   placing the semiconductor substrate into the sputter chamber;
   introducing a first gas into the sputter chamber, and performing a first sputtering process to the semiconductor substrate to form a metal nitride layer on the semiconductor substrate, which has a first thickness; and
   introducing a second gas into the sputter chamber, and performing a second sputtering process to the semiconductor substrate to form a metal oxide layer on the metal nitride layer, wherein the metal oxide layer has a second thickness.

5. The method as claimed in claim 1, further comprising:
   conformally forming a barrier liner layer on the first electrode, the resistive switching layer, and the second electrode.

6. The method as claimed in claim 1, wherein the dopant comprises carbon, boron, or combinations thereof.

7. The method as claimed in claim 1, wherein the step of forming the first electrode comprises:
   forming a first metal nitride layer having a first thickness on the on the semiconductor substrate; and
   forming a metal oxide layer having a second thickness on the first metal nitride layer.

8. The method as claimed in claim 7, wherein the step of forming the first electrode further comprises:
   forming a second metal nitride layer having a third thickness on the metal oxide layer.

9. The method as claimed in claim 8, wherein the second metal nitride layer has the dopant within and contacts the resistive switching layer.

* * * * *